US007864532B1

(12) United States Patent
Ehret et al.

(10) Patent No.: US 7,864,532 B1
(45) Date of Patent: Jan. 4, 2011

(54) MOLDED OR ENCAPSULATED TRANSMIT-RECEIVE MODULE OR TR MODULE/ANTENNA ELEMENT FOR ACTIVE ARRAY

(75) Inventors: Timothy Ehret, Medford, NJ (US); Bradley M. Smith, Mount Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 173 days.

(21) Appl. No.: 11/944,676

(22) Filed: Nov. 26, 2007

Related U.S. Application Data

(62) Division of application No. 11/402,176, filed on Apr. 11, 2006, now Pat. No. 7,363,701, which is a division of application No. 10/967,834, filed on Oct. 18, 2004, now Pat. No. 7,168,152.

(51) Int. Cl.
*H05K 7/20* (2006.01)

(52) U.S. Cl. ....................... 361/713; 361/700; 361/704; 165/104.26; 165/104.33; 174/15.1; 174/50; 257/714

(58) Field of Classification Search ............ 165/104.26, 165/104.33; 361/688–690, 697, 699, 700, 361/704, 709, 711, 713, 715, 719
See application file for complete search history.

(56) References Cited

U.S. PATENT DOCUMENTS 4,047,198 A * 9/1977 Sekhon et al. .............. 257/713
4,366,526 A 12/1982 Lijoi et al.
5,017,927 A 5/1991 Agrawal et al.
5,339,086 A 8/1994 DeLuca et al.
5,380,386 A 1/1995 Oldham et al.
5,495,262 A 2/1996 Klebe
5,496,262 A 3/1996 Johnson, Jr. et al.
6,133,631 A 10/2000 Belady
6,163,073 A 12/2000 Patel
6,181,282 B1 1/2001 Gans et al.
6,366,261 B1 4/2002 Stout et al.
6,430,805 B1 8/2002 Ekmekji et al.
6,442,023 B2 * 8/2002 Cettour-Rose et al. ...... 361/690
6,665,187 B1 * 12/2003 Alcoe et al. ................. 361/719
6,812,905 B2 11/2004 Thomas et al.
6,880,626 B2 * 4/2005 Lindemuth et al. ..... 165/104.26
6,915,843 B2 7/2005 Kroliczek et al.
7,005,738 B2 2/2006 Zuo et al.
7,092,255 B2 * 8/2006 Barson et al. ............... 361/699
7,106,588 B2 * 9/2006 Oberlin et al. .............. 361/700
7,168,152 B1 1/2007 Ehret et al.
7,213,338 B2 * 5/2007 Tonosaki et al. ....... 29/890.035
7,551,439 B2 * 6/2009 Peugh et al. ................ 361/699

* cited by examiner

*Primary Examiner*—Jayprakash N Gandhi
*Assistant Examiner*—Courtney Smith
(74) *Attorney, Agent, or Firm*—Duane Morris LLP

(57) ABSTRACT

An array of electrically conductive waveguides is made a method including defining slots in broad surfaces of planar dielectric slabs. The surfaces of the slabs, including slots, are metallized. The broad sides of the slabs are juxtaposed, with the slots registered with the planar surfaces of another slab, to form one or more closed waveguides. The waveguides may feed microchips, or act as antennas. The slabs may include electrical conductors andor heat pipes. Heat pipes are made by defining apertures with the dielectric slabs, and introducing wick material into the apertures.

23 Claims, 8 Drawing Sheets

MOLDED OR ENCAPSULATED TRANSMIT-RECEIVE MODULE OR TR MODULE/ANTENNA ELEMENT FOR ACTIVE ARRAY

CROSS-REFERENCE TO RELATED APPLICATIONS

This application is a divisional of U.S. patent application Ser. No. 11/402,176, filed Apr. 11, 2006 , now U.S. Pat. No. 7,363,701 which is a divisional of U.S. patent application Ser. No. 10/967,834, filed Oct. 18, 2004, now U.S. Pat. No. 7,168, 152.

FIELD OF THE INVENTION

This invention relates to active array antennas, and more particularly to active transmit, receive, or transmit-receive modules or elements which are encapsulated in dielectric material.

BACKGROUND OF THE INVENTION

Active antenna arrays are increasingly required for sensors, communications, and electronic warfare systems. Active antenna arrays are arrays of antenna elements in which each antenna element or subset of antenna elements is driven by, or drives, one or more active radio-frequency (RF) device (s) such as a monolithic microwave integrated circuit (MMIC). Some prior art arrangements associate a transmit-receive (TR) module with each antenna element, as described in U.S. Pat. No. 5,017,927, issued May 21, 1991 in the name of Agrawal et al. or with a subset of antenna elements of the array, as described in U.S. Pat. No. 5,339,086, issued Aug. 16, 1994 in the name of DeLuca et al. Active array antennas are advantageous in that their beams can be steered instantaneously by simply adjusting the relative phase shifts of the signals to each antenna element or subset. They have the disadvantage, in general, of being expensive by comparison with antenna types such as reflector antennas.

At one time, the cost of the microwave monolithic integrated circuit (MMIC) was a major cost obstacle, and other costs, such as the TR module and antenna structure, were secondary. The art of making MMICs has improved, and their cost has decreased to a point at which the cost of the TR module structure and the antenna array structure have become important relative cost factors. Improved TR module arrangements for active antenna arrays are desired.

SUMMARY OF THE INVENTION

A method for making an integrated active antenna array element according to an aspect of the invention includes the steps of placing partially within a first mold at least a first electrical power conductor set extending to a first location adjacent a predetermined location within the mold, and placing at least partially within the mold at least one heat pipe extending to a second location which is adjacent the predetermined location. The first mold is filled with solid dielectric material in such a manner as to define a first planar surface. A first elongated cavity is defined in the first planar surface. The first elongated cavity extends from an edge of the solid dielectric to a third location within the solid dielectric material adjacent the predetermined location, a second elongated cavity extends from a fourth location within the solid dielectric to another edge of the solid dielectric material, and the first planar surface also defines at least a first recess adjacent the first, second, third and fourth locations within the solid dielectric material. The method includes the step of applying an electrically conductive material, such as a metal, to the first planar surface, and to the first and second elongated cavities. A solid-state active device is placed at least partially within the first recess. The solid-state active device defines a power terminal adjacent the first location, and first and second RF ports adjacent the third and fourth locations. The power conductor is connected to a power terminal of the solid-state active device, and the first and second RF ports, respectively, are adjacent to the first and second elongated cavities at the third and fourth locations, respectively. The second mold is filled with second solid dielectric molding material in such a manner as to define a second planar surface, and a third elongated cavity is defined in the second planar surface. The third elongated cavity extends from an edge of the second solid dielectric to a fifth location within the second solid dielectric, and a fourth elongated cavity extends from a sixth location within the second solid dielectric to another edge of the second solid dielectric. The first and second planar surfaces are juxtaposed, with the third and fourth elongated cavities registered with the first and second elongated cavities, respectively, to define hollow electromagnetic waveguides extending from the first and second edges to the first and second RF ports of the active device, respectively, and coupled thereto. In a particularly advantageous mode of this aspect of the invention, digital control electrical conductors are at least partially inserted into the second mold before filling with dielectric material, and a second recess is defined within the solid dielectric material in the second mold, the second recess intersecting the digital control electrical conductors. A solid-state active digital device defining at least digital ports is placed at least partially within the second recess, with the digital ports in communication with the digital control electrical conductors. The step of filling the first mold with solid dielectric molding material may comprise the step of filling the first mold with liquid molding material, and hardening the liquid molding material to form the solid dielectric material, or it may comprise the steps of filling the first mold with solid material, and milling the first and second cavities and the first recess from the solid material in the first mold. As an alternative to milling, the step of defining a first elongated cavity, a second elongated cavity, and at least a first recess in the first planar surface, comprises the steps of defining first and second elongated ridges and a first elevated region in a planar surface of the first mold, to thereby define the first and second elongated cavities and the first recess in the planar surface of the dielectric molding material when the dielectric material is removed from the first mold.

According to another aspect of the invention, an arrangement comprises a solid dielectric mass enclosing an encapsulated heat-producing active electrical element, and also enclosing a heat pipe in thermal communication with the electrical elements. The heat pipe is defined by an elongated channel, the inner surface or wall of which is the dielectric molding material. The heat pipe channel extends through the dielectric mass to a location remote from the electrical element. The channel defining the heat pipe in this aspect of the invention is defined only by the hollowed-out dielectric molding material, and not by any other material. The heat pipe also includes a wick extending along substantially the entire length of the channel and a vaporizable coolant liquid within the channel. In a particular embodiment of this aspect of the invention, the wick comprises powdered material, which may be at least partially metallic. The wick is wetted by the coolant. In another embodiment, the wick comprises a roughened surface, and the roughened surface may be defined by at least longitudinal grooves in the defining channel.

A method for making an encapsulated heat pipe according to another aspect of the invention comprises the steps of placing a removable elongated solid partially within a mold, and filling the mold with solid dielectric material. This may be done by filling the mold with hardenable liquid dielectric molding material. The elongated solid is removed from the dielectric material, to thereby define an elongated cavity extending within the solid dielectric material. Wick material is inserted into the periphery of the elongated cavity. Coolant liquid is introduced or injected into the elongated cavity, and the open end of the elongated cavity is closed or sealed. In a particularly advantageous mode of this method, the step of inserting wick material includes the steps of inserting into the elongated cavity a rod having transverse dimensions smaller than those of the cavity, and inserting powdered wick material into the interstice between the rod and the elongated cavity. In a further advantageous variant of this aspect of the invention, the step of placing a removable elongated solid partially within a mold includes the step of placing partially within the mold a removable elongated solid having an outer surface defining longitudinally disposed lands and grooves, which thereby result in corresponding longitudinal grooves and lands, respectively, in the elongated cavity.

A method for making a heat pipe according to an aspect of the invention includes the steps of defining an elongated cavity or channel in first and second planar surfaces of first and second dielectric solids, respectively, so that when the first and second planar surfaces are juxtaposed, the elongated channels are in registry. Wick material is introduced or included within at least a portion of at least one of the elongated channels. The first and second planar surfaces are juxtaposed in a sealing manner to thereby define at least one closed channel, and liquid coolant is introduced into or placed within the closed channel. In one advantageous mode of this method, the step of placing liquid coolant is performed after the step of juxtaposing in a sealing manner, and the step of placing liquid coolant includes the step of injecting a predetermined amount of coolant into the channel. In this mode, the step of injecting is followed by a step of sealing an injection aperture.

A method according to an aspect of the invention is for making an integrated active antenna array element with an integral antenna. The method comprises the steps of placing partially within a first mold at least a first power electrical conductor set which extends to a first location adjacent a predetermined location, and placing at least partially within the mold at least one heat pipe extending to a second location adjacent the predetermined location. The first mold is filled with solid dielectric material in such a manner as to define a first planar surface, and to also define in the first planar surface a first elongated cavity extending from an edge of the solid dielectric material to a third location adjacent the predetermined location within the solid dielectric material, a second elongated cavity extending from a fourth location adjacent the predetermined location within the solid dielectric material to another edge of the solid dielectric material, and also defining at least a first recess adjacent the first, second, third and fourth locations within the solid dielectric material, the first elongated cavity having sides which run parallel with a central axis of the first channel or are mutually parallel, and the second elongated cavity having at least one pair of diverging sides, or at least one side which diverges away from the central axis of the second elongated cavity adjacent the other edge of the solid dielectric material, and optionally having parallel sides or sides extending parallel to the central axis adjacent the fourth location. Electrically conductive material is applied to the first planar surface, and to the first and second elongated cavities. A solid-state active device is placed at least partially within the first recess. The solid-state active device defines a power terminal adjacent the first location, and first and second RF ports adjacent the third and fourth locations. The power conductor is connected to the power terminal of the solid-state active device, and the first and second RF ports, respectively, are adjacent to the first and second elongated cavities at the third and fourth locations, respectively. The second mold is filled with second solid dielectric molding material in such a manner as to define a second planar surface and a third elongated cavity extending from an edge of the second solid dielectric to a fifth location within the second solid dielectric, and a fourth elongated cavity extending from a sixth location within the second solid dielectric to another edge of the second solid dielectric. The first and second planar surfaces are juxtaposed, with the third and fourth elongated cavities similarly dimensioned to the first and second elongated cavities, respectively, and registered with the first and second elongated cavities, respectively, to define electromagnetic waveguides extending from the first and second edges to the first and second RF ports of the active device, respectively, and coupled thereto.

A method for making at least one, or in some modes of the method, a plurality of electrically conductive hollow waveguides for carrying electromagnetic signal. The method comprises the step of defining at least an elongated first slot extending from an edge of a generally planar solid dielectric first slab, across at least a portion of a first broad surface thereof. The defining step may be accomplished by cutting into the broad surface, or by molding the dielectric with the slot in situ. An elongated second slot is defined, extending from an edge of the generally planar solid dielectric first slab, across at least a portion of a second broad surface thereof. At least on elongated first slot is defined, extending from an edge of a generally planar solid dielectric second slab, across at least a portion of a first broad surface thereof. At least an elongated second slot is defined, extending from an edge of the generally planar solid dielectric second slab, across at least a portion of a second broad surface thereof. At least the surfaces of the first and second slots, and at least portions of the first and second broad surfaces of the first and second slabs, are rendered conductive. The rendering conductive may be by application of an electrically conductive material, such as a metal, to the dielectric surfaces. The first broad surface of the first slab is juxtaposed with the second broad surface of the second slab, with the first slot of the first slab registered with the electrically conductive portions of the second broad surface of the second slab, which results in defining a circumferentially-closed, electrically conductive tube or channel, suitable for carrying electromagnetic signal.

In a particularly advantageous mode of this aspect of the invention, further steps are added. The further steps include the steps of defining at least an elongated first slot extending from an edge of a generally planar solid dielectric third slab, across at least a portion of a first broad surface thereof, and defining at least an elongated second slot extending from an edge of the generally planar solid dielectric third slab, across at least a portion of a second broad surface thereof. At least the surfaces of the first and second slots, and at least portions of the first and second broad surfaces, of the third slab are rendered conductive. The first broad surface of the third slab is juxtaposed with the second broad surface of the first slab, with the first slot of the third slab registered with the electrically conductive portions of the second broad surface of the first slab. This has the result of producing electrically conductive tubes on both sides of the first slab.

DESCRIPTION OF THE INVENTION

Figure 1A:
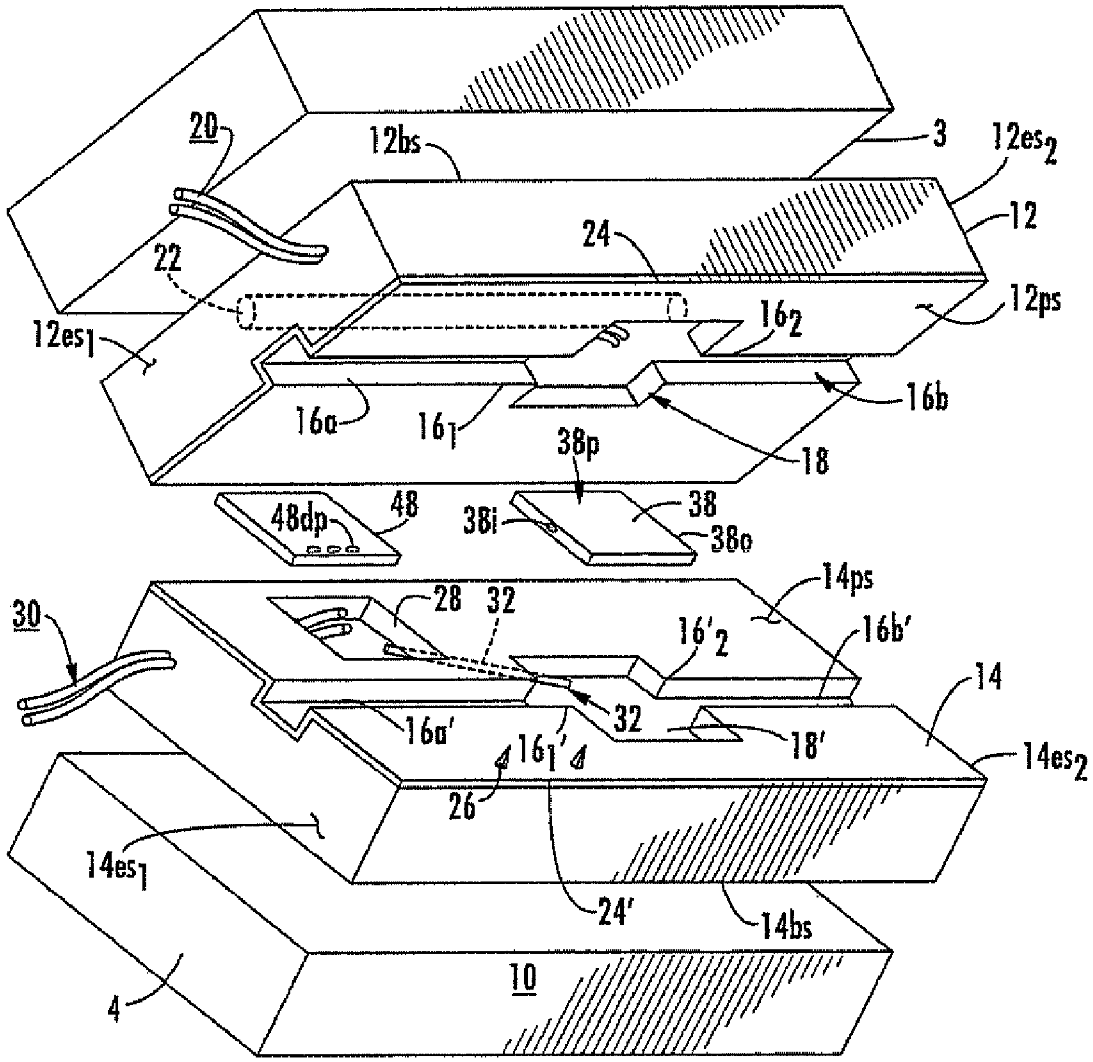
FIG. 1*a* is a simplified perspective or isometric view, exploded to illustrate interior details, of a bipartite structure according to an aspect of the invention.

In FIGS. 1*a*, 1*b*, 1*c*, and 1*d*, a structure 10 includes an upper dielectric slab 12 and a lower dielectric slab 14. In this context, the terms "upper" and "lower" refer to the position of the elements in the drawings, and are not intended to indicate the position of the actual element when fabricated or in use. The dielectric materials of the upper and lower slabs may be the same or they may be different, and the slab itself may be made by machining from a larger mass of dielectric material, or it may made by hardening a liquid molding material in a mold. The molds in which the upper and lower slabs 12 and 14, respectively, may be formed are illustrated as 3 and 4, respectively.

Dielectric slab 12 defines a planar surface 12*ps* and a back surface 12*bs*, and end surfaces 12*es*1 and 12*es*2. A depression or recess 18 is defined in planar surface 12*ps*. As illustrated, the recess 18 is generally rectangular, and is not so deep as to open to rear or back surface 12*bs*. A first channel or groove 16*a* is defined in planar surface 12*ps*, and extends from edge 12*es*1 to a location $\mathbf{16}_1$ adjacent recess 18. A second channel or groove 16*b* extends from edge 12*es*2 to a location $\mathbf{16}_2$ adjacent recess 18. As illustrated, channels 16*a* and 16*b* are generally rectangular, of similar dimensions, and colinear. In general, there is no requirement that they be rectangular, colinear, or have the same dimensions. Also, the channels 16*a*, 16*b* need not be straight.

Figure 1B:
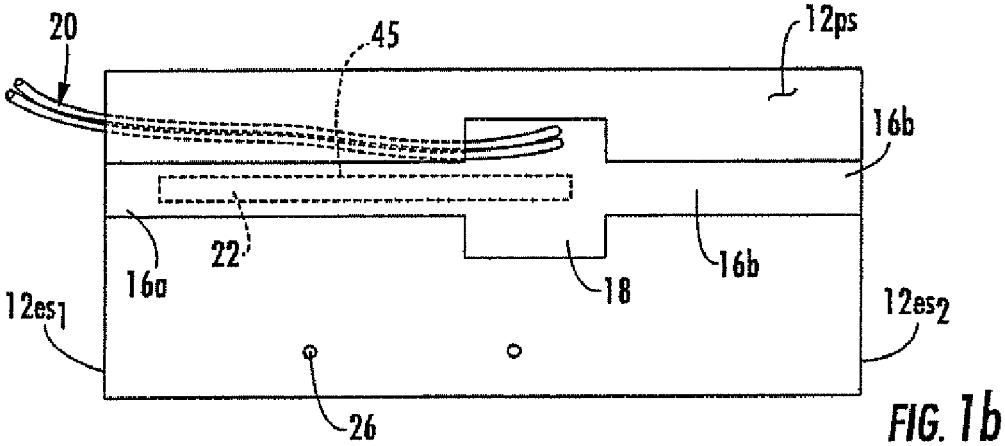
FIG. 1*b* is a plan view of one portion of the bipartite structure of FIG. 1*a*.

A first set of electrical conductors 20 of FIGS. 1*a* and 1*b* extends through the dielectric slab 12 from edge surface 12*es*1 into recess 18. A heat pipe designated 22 extends through dielectric slab 12 and into a region adjacent recess 18. In the particular embodiment illustrated in FIGS. 1*a*, 1*b*, and 1*c*, the heat pipe 22 extends into a region between recess 18 and back surface 12*bs*. At least the planar surface 12*ps*, the exposed walls of channels 16*a* and 16*b*, and the walls of recess 18 are rendered electrically conductive, as for example by metallization designated 24.

Figure 1C:
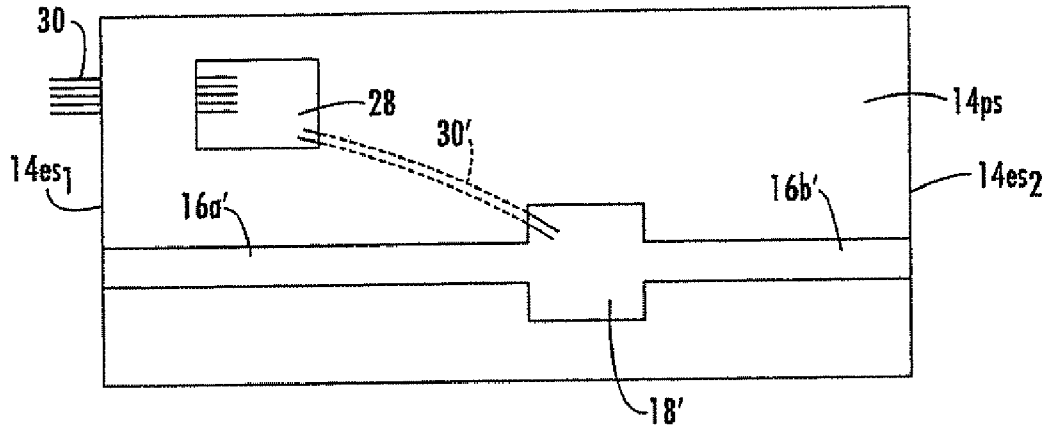
FIG. 1*c* is a plan view of another portion of the bipartite structure of FIG. 1*a*.

Dielectric slab 14 of FIGS. 1*a* and 1*c* defines a planar surface 14*ps* and a back surface 14*bs*, and end surfaces 14*es*1 and 14*es*2. A depression or recess 18'is defined in planar surface 14*ps*. As illustrated, the recess 18' is generally rectangular, and is not so deep as to open to rear or back surface 14*bs*. A first channel or groove 16*a*' is defined in planar surface 14*ps*, and extends from edge 14*es*1 to recess 18'. A second channel or groove 16*b*' extends from edge 14*es*2 to recess 18'. A second recess or depression illustrated as 28 is defined in planar surface 14*ps*. A set of digital electrical control conductors 30 extends at least from end surface 14*es*1 into recess 28, and a further set of conductors 30' may extend from recess 28 into recess 18'. The upper planar surface 14*ps*, the interior walls of channels 16*a*' and 16*b*', and the walls of recesses 18' and 28 are rendered electrically conductive, as by metallization 24'. Channels 16*a*' and 16*b*', and recess 18' of dielectric slab 14 are registered with channels 16*a*, 16*b*, and recess 18, respectively, when the planar surfaces 12*ps* and 14*ps* of dielectric slabs 12 and 14 are properly juxtaposed. The two slabs 12 and 14 may include registration pins/aperture sets or the like, one of which is illustrated as 26.

In FIG. 1*a*, a monolithic microwave integrated circuit (MMIC) 38 defines a first port 38*i* and a second port 380, and also defines a power terminal 38*p*. These ports may be input and output ports, respectively. Before the electrically conductive planar surfaces of slabs 12 and 14 are juxtaposed, an active device such as a monolithic microwave integrated circuit (MMIC) 38 is electrically connected to power conductor set 20, and the MMIC 38 is inserted into recess 18. Also before the slabs 12 and 14 are juxtaposed, control connections may be made between the MMIC 38 and conductor set 32. These power and control connections may be press connections made through pressure-operated connectors, or they may be fusion or other connections. Similar connections are made between a digital integrated circuit illustrated as a block 48 and at least conductor set 30, and possibly conductor set 32.

When the electrical connections have been provided for by either providing press-type connections or actual electrical fusion or other connections, the dielectric slabs 12 and 14 are juxtaposed with the channels 16*a* and 16*b*, and recess 18, registered with channels 16*a*' and 16*b*', and recess 18', and fastened together. When so assembled, with the channels registered, the juxtaposed channels 16*a*, 16*a*' and 16*b*, 16*b*' define rectangular waveguides with electrically conductive sides, such as are well known in the art. The rectangular waveguide 16*a*, 16*a*' extends from end surface 12*es*1/14*es*1 to the MMIC in recess 18/18', and rectangular waveguide 16*b*/16*b*' extends from recess 18/18' to end surface 12*es*2/14*es*2. Those skilled in the art will recognize this arrangement as constituting a method for feeding radio-frequency (RF) signals to a MMIC for processing, and for removing processed RF signals therefrom.

Those skilled in the art know that the term "radio frequency" at one time identified a range of frequencies, but that the term in that restricted sense is now obsolescent or obsolete. The term "radio frequency" or "RF" now means almost any electromagnetic frequency, ranging almost from audio frequencies to almost light frequencies.

Figure 1D:
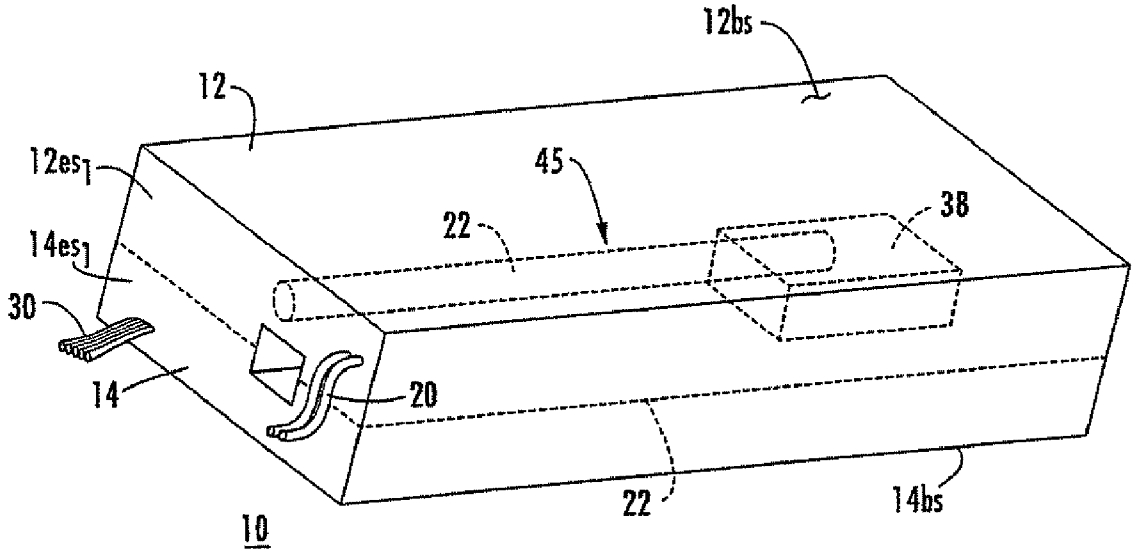
FIG. 1*d* is a perspective or isometric view of the structure of FIG. 1*a* in its assembled form.

MMIC 38 of FIG. 1*a* may be a simple RF amplifier, or it may be a simple phase shifter or attenuator, or it may include amplifiers, phase shifters, attenuators, and RF switches, for performing extensive processing under command of digital command signals from digital control integrated circuit 48. Ordinarily, heat is developed by such integrated circuits. The close spacing of elements in an array structure exacerbates the problems of heat transfer from the active elements to ambient. According to an aspect of the invention, the dielectric structure including dielectric slabs 12 and 14 includes a heat pipe extending to the region of the MMIC or other active device, and thermally coupled thereto, for transferring heat away from the region close to the MMIC to regions more remote. As illustrated in FIGS. 1*a*, 1*b*, and 1*d*, the heat pipe 22 extends from "under" the MMIC location in recess 18 to a more remote region or location designated 45. As illustrated, heat pipe 22 extends between recess 18 and back surface 12*bs*, so it is relatively close to surface 12*bs* in the remote region 45. However, heat pipe 22 could extend from the region of recess 18 to a location adjacent any surface of dielectric slab 12 from which heat can be conveniently removed when the structure 10 is coupled to an array antenna.

Figure 2A:
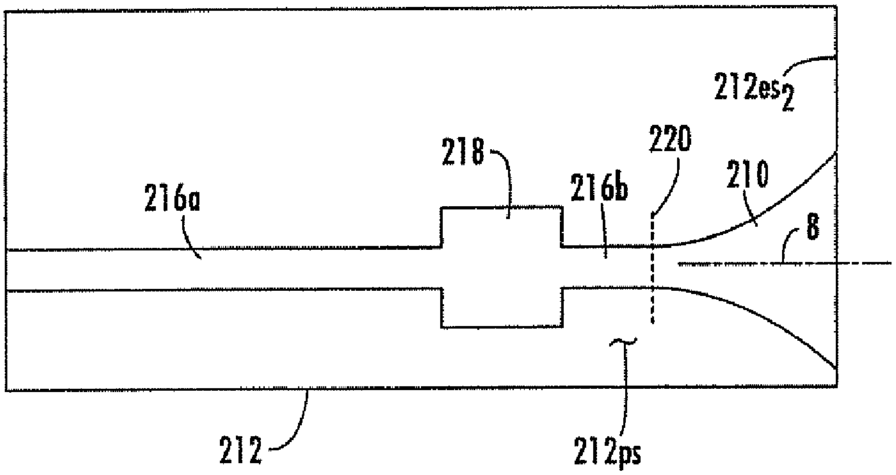
FIG. 2*a* is a simplified plan view of one dielectric slab of a structure according to another aspect of the invention.
Figure 2B:
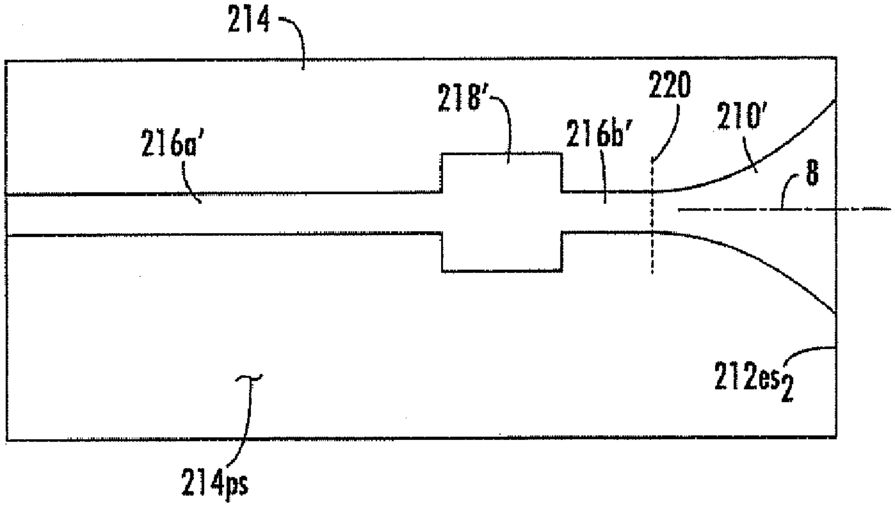
FIG. 2*b* is a corresponding plan view of another dielectric slab.
Figure 2C:
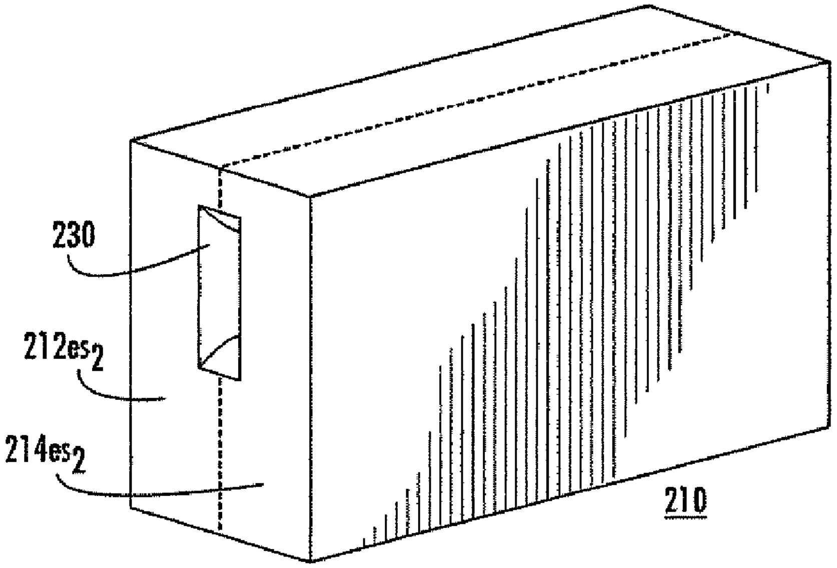
FIG. 2*c* is a perspective or isometric view of the slabs of FIGS. 2*a* and 2*b* juxtaposed, to show an antenna aperture.

According to another aspect of the invention, one of the channels can be coupled to an antenna for use of the structure 10 as one element among a plurality feeding an antenna array. FIGS. 2*a*, 2*b*, and 2*c* illustrate a structure 210 according to an aspect of the invention in which two dielectric slabs 212 and 214 define planar surfaces 212*ps* and 214*ps*, respectively. A first half-waveguide channel 216*a* is defined in surface 212 ps, and a mating half-waveguide channel 216' is defined in surface 14*ps*. Mating recesses 218 and 218' abut the end of channels 216*a* and 216*a*'. A further half-waveguide 216*b* extends from recess 218 toward an end surface 212*es*2, and a mating half-waveguide extends from recess 218' toward end surface 214*es*. Beyond a plane 220 lying between recesses 218 and 218' when the dielectric slabs 212 and 214 are juxtaposed, the walls defining the channel 216*b* and 216*b*' flare away from a central axis 8, to thereby define a horn antenna. The aperture 230 of the horn antenna is visible in FIG. 2*c*.

Figure 3A:
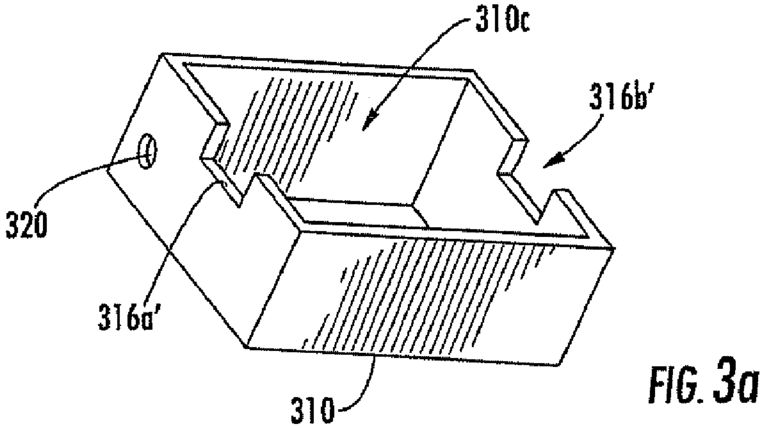
FIG. 3*a* is a simplified perspective or isometric view of a dielectric mold insert defining an aperture, channel cutouts and a power conductor clearance aperture.
Figure 3B:
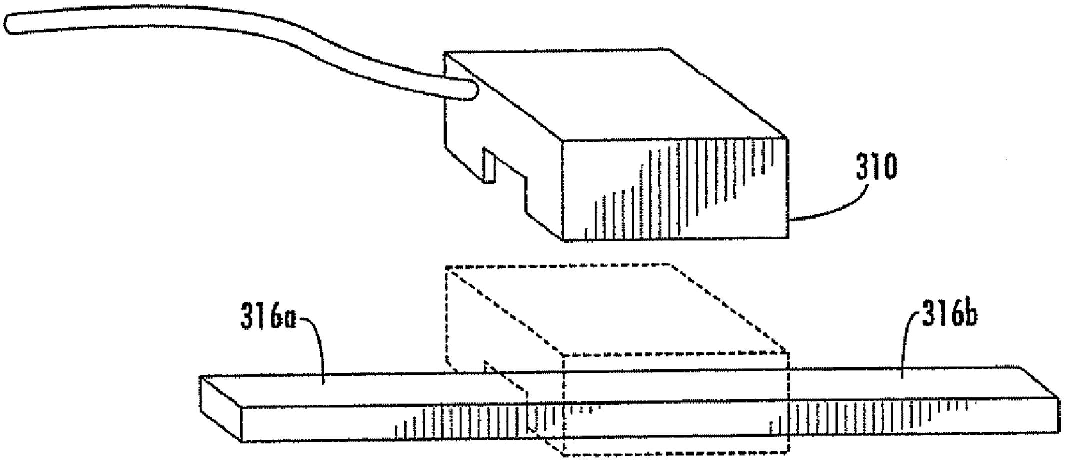
FIG. 3*b* is an illustration of a channel-forming mold insert together with the mold insert of FIG. 3*a*.
Figure 3C:
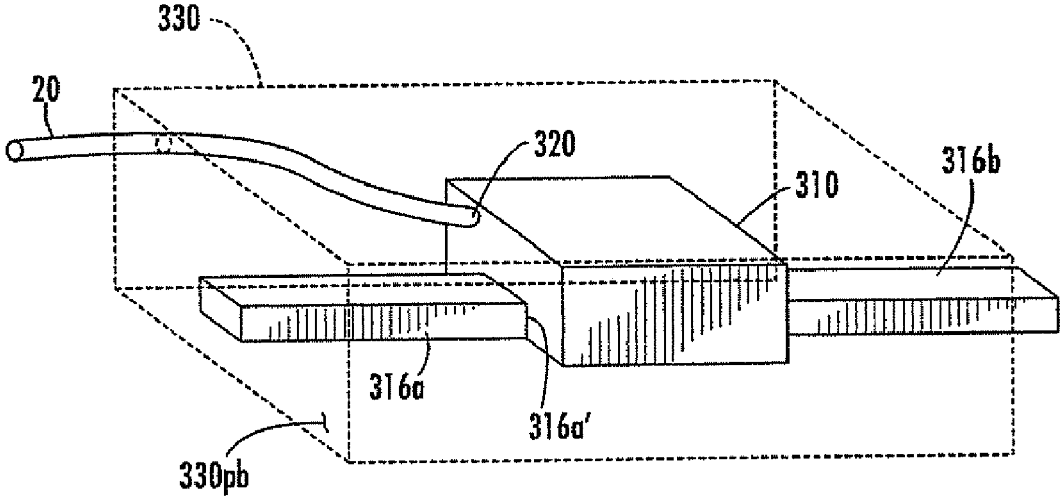
FIG. 3*c* illustrates the structures of FIG. 3*b* assembled together with electrical conductors into a mold illustrated in phantom.

FIGS. 3*a*, 3*b*, and 3*c* together illustrate the technique for molding the electrically conductive wires into the same structure with the channels and recesses. In FIG. 3*a*, a form 310 is made from a dielectric material, and preferably from a molding material which is the same as that of the dielectric slabs. Form 310 as illustrated is rectangular, but may be of any shape. The interior cavity 310*c* of form 310 has the desired dimensions of recess 18 of FIG. 1*a* or 1*b*, or of recess 218 of FIG. 2*a*. Form 310 defines an electrical conductor clearance aperture 320. Form 310 also defines a pair of rectangular cutouts 316*a*' and 316*b*' which are dimensioned to fit over channel moldings 316*a* and 316, respectively, as illustrated in FIG. 3*b*. The channel moldings 316*a* and 316*b* may be different portions of one continuous channel, as illustrated in FIG. 3*b*. The channel molding is defined or placed on the planar bottom 330*pb* of a cavity mold 330 (illustrated in phantom), as illustrated in FIG. 3*c*, and the form 310 is placed over the channel 316*a*/316*b* at the appropriate location. The electrical conductor 20 is extended through aperture 320 in form 310, and through another clearance aperture 340 in a side of the cavity mold 330. The mold is then filled (not illustrated) with hardenable liquid molding material, and hardened. The resulting dielectric slab, when removed from mold 330, will define the channels 16*a* and 16*b* intersecting a recess 18, all as illustrated in FIG. 1*a*, with the conductors 20 extending into recess 18 and from end surface 12*es*1. The aperture or recess 28, and any other recesses, with or without electrical conductor or wire intersections, can be made in the same manner. If wire intersections are not needed for a recess, the recess can be machined into the planar surface of the dielectric slab after hardening. The second dielectric slab, namely slab 14 of FIG. 1*a*, can be made by a mold generally similar to that of FIG. 3*c*.

Figure 4:
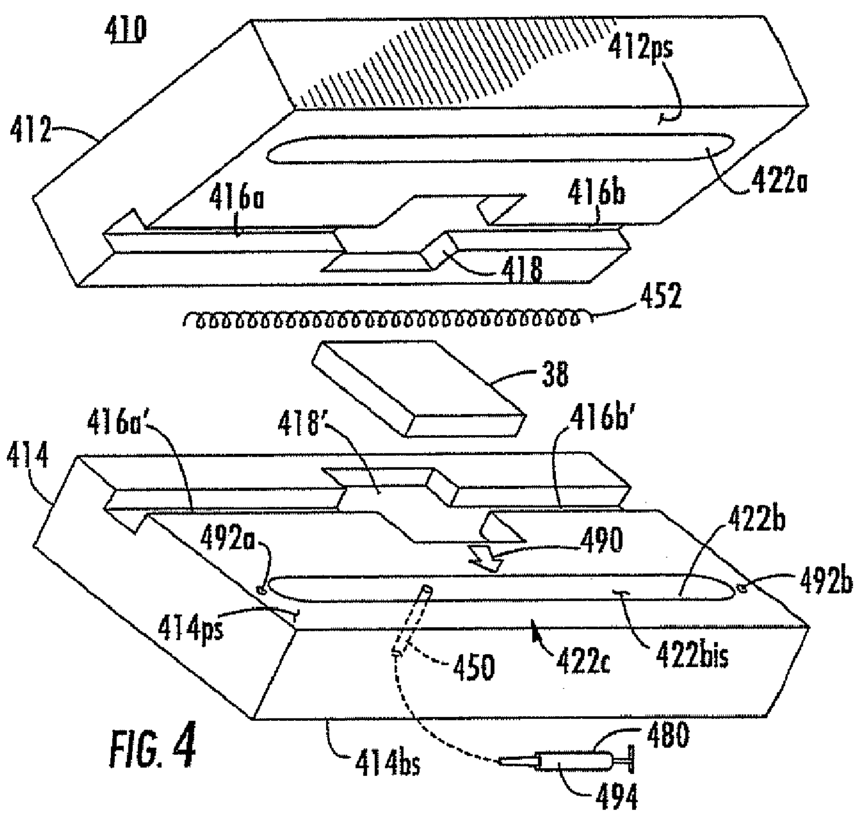
FIG. 4 is a simplified, exploded, perspective or isometric view of a bipartite dielectric structure according to another aspect of the invention, illustrating a heat pipe defined within the dielectric structure, and an aperture by which the heat pipe may be loaded with coolant.

According to another aspect of the invention, the walls of the heat pipe is defined by an opening or aperture formed within the slab, so that the dielectric material itself forms at least a portion of the walls of the heat pipe. FIG. 4 is a simplified perspective or isometric view of two dielectric slabs, which when juxtaposed make a structure generally similar to that of FIG. 1*d* or 2*c*. More particularly, the arrangement of FIG. 4 shows first and second dielectric slabs 412 and 414, respectively, each with a planar surface 412*ps* and 414*ps*. A pair of matching waveguide-half channels 416*a*, 416*a*' and another pair 416*b*, 416*b*' are defined in the planar surfaces, intersecting mating recesses 418, 418'. In the arrangement of FIG. 4, an elongated, a closed-end channel 422*a* and 422*b* is defined or machined into the planar surfaces 412*ps* and 414*ps*, respectively, of dielectric slabs 412 and 414. As with the other channels, closed-end channels 422*a* and 422*b* are registered when the dielectric slabs 412 and 414 are juxtaposed, to form an interior channel which does not communicate with the exterior of the conjoined structure. This elongated channel defines the walls of a heat pipe. The channels 422*a*, 422*b* are defined in a region such that the heat pipe is in thermal communication 490 with the source of heat, which is the integrated circuit 38. In general, the thermal communication is greatest when the distance between the source and the sink is minimized. Consequently, the heat pipe defined by channels 422*a*, 422*b* has its center region 422*c* at a location near aperture 418, 418'. Having the center of the heat pipe adjacent the heat source results in what amounts to two heat pipes, each communicating thermally at 490, carrying the heat to remote locations adjacent the ends of the heat pipe, which locations are designated 492*a* and 492*b*.

During the formation or machining of the two channel halves 422*a* and 422*b* in the two dielectric slabs 412 and 414, a small aperture is defined between one of the channels and an exterior surface of the dielectric slab. For example, a hole such as 450 can be drilled through dielectric slab 414 between channel 422*b* and the back surface 414*bs* of slab 414. This aperture provides access after the two halves 412, 414 of the dielectric structure are conjoined to form a closed channel from the two halves 422*a* and 422*b*. A heat pipe also needs a wick. The wick is illustrated in FIG. 4 as an elongated structure 452, which fits into one half of the heat pipe channel 422*a*, 422*b* before juxtaposition of the dielectric slabs 412 and 414. Thus, the wick 452 lies within the closed channel 422*a*, 422*b* after juxtaposition of the dielectric slabs and sealing of the juncture. All that is then required is to inject the appropriate amount of coolant or heat transfer liquid 494 into the channel 422*a*, 422*b* through aperture 450, as suggested in FIG. 4 by the measuring syringe 480, and to seal the aperture. In some cases, it may be desirable to evacuate the heat pipe channel before filling it with liquid.

As an alternative to the use of a discrete wick 452 as illustrated in FIG. 4, one may use wicking material such as metal-containing sintered material or powder. This can be adhesively attached to the walls of the channels defining the heat pipe, or pressed into the walls of the channel.

Figure 5A:
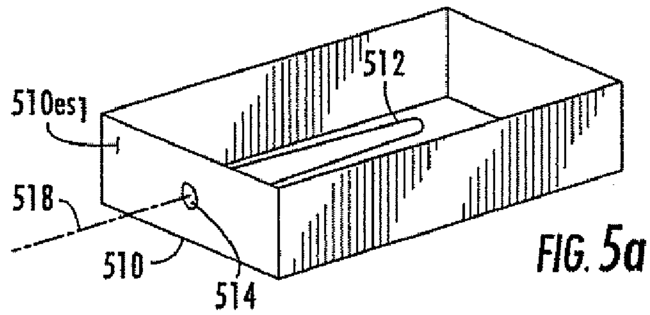
FIG. 5*a* is a simplified illustration of a mold including a removable fluted rod insert.
Figure 5B:
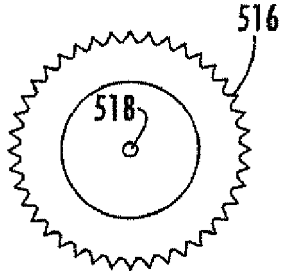
FIG. 5*b* is a cross-section of the rod showing the flutes or channels extending along its outer surface.
Figure 5C:
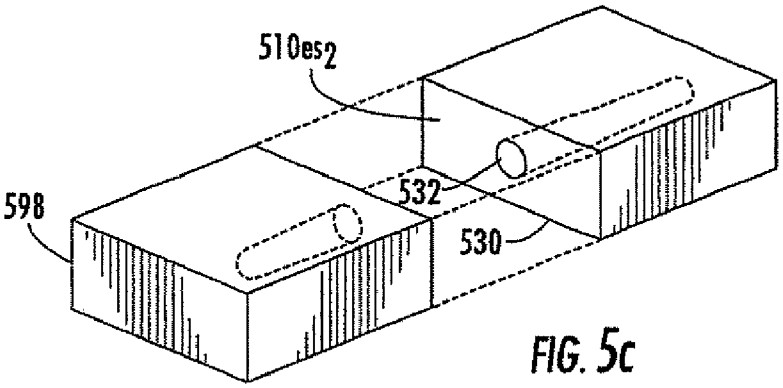
FIG. 5*c* illustrates the result of removing the rod and dielectric from the mold of FIG. 5*a;*

As an alternative to the introduction of a wick into the heat pipe channel or affixation of wick material to the walls of the channel, the walls of the channel may be roughened. This can be done by a machining process during formation of the channel. As an alternative way to roughen the surface of the walls of the heat pipe channel, to thereby define a wicking surface, a molding rod having a roughened surface can be used to define the channel in conjunction with a molding step. FIG. 5*a* illustrates an open-top rectangular mold cavity 510 with a straight, elongated rod 512 removably affixed at a location 514 on a side of the mold for holding the rod 512 in place when the mold cavity is filled with molding material. Rod 512 defines an axis 518. FIG. 5*b* is a cross-sectional representation of the rod 512, showing a plurality or set 516 of small or fine axial grooves or indentations on the surface of the rod, parallel with the axis 518. So long as a mold parting material is used, or the relative coefficients of expansion and contraction of the rod and molding material are suitable, the rod can be removed from the molding material by simply pulling it out of the hardened molding material. The removal leaves an elongated cavity with axially-disposed wicking channels. When the dielectric slab is removed from the mold, it has an appearance similar to that of 530 of FIG. 5*c*, showing an exposed heat pipe aperture 532 in a planar surface 510*es*2. A closed heat pipe channel can be formed by making two items such as 530 of FIG. 5*c* and juxtaposing the dielectric slabs with their exposed heat pipe apertures 532 abutted and the joint sealed, as suggested by the structure 598 of FIG. 5*c*.

Figure 6A:
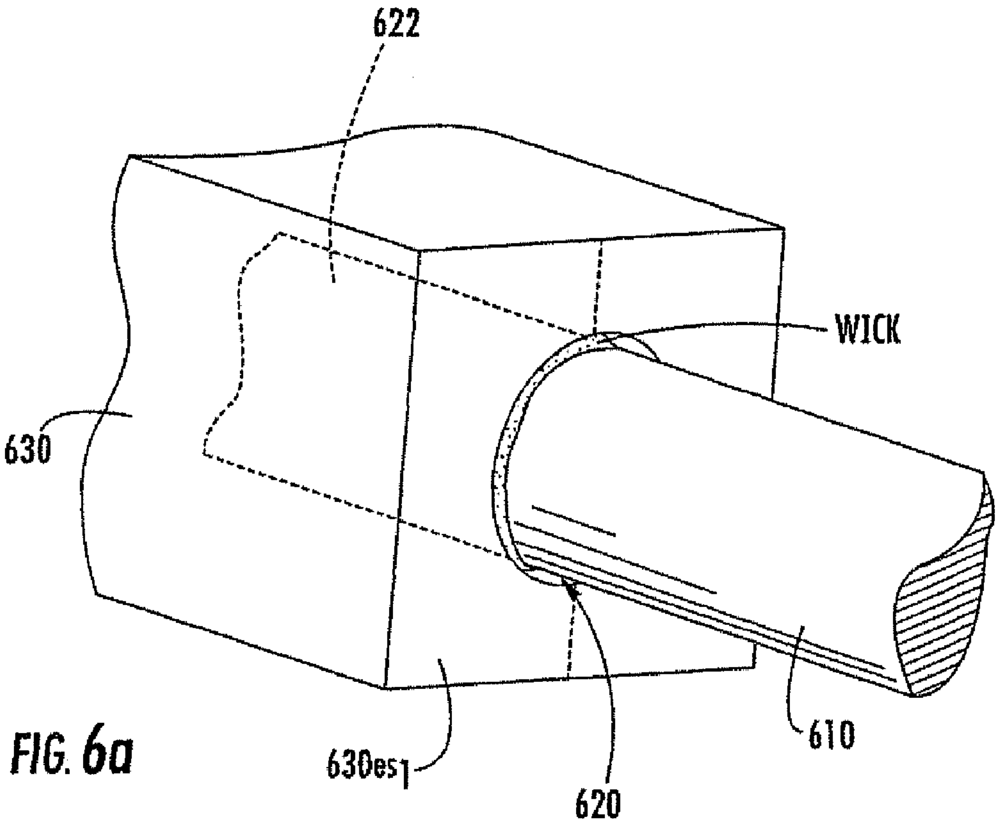
FIG. 6*a* is a simplified representation of a portion of a dielectric slab with an aperture, and a rod within the aperture which leaves an interstice into which powdered or sintered wick material may be introduced.
Figure 6B:
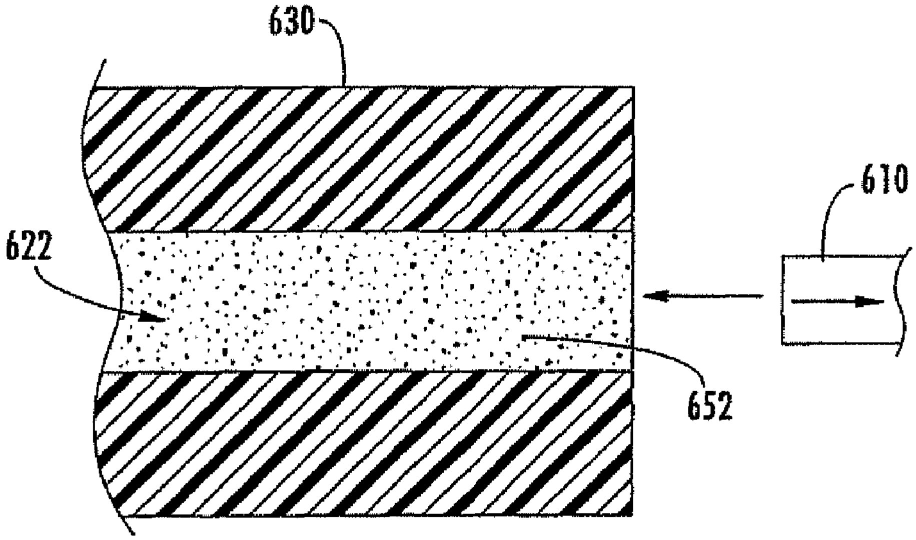
FIG. 6*b* is a simplified representation of a longitudinal cross-section of the aperture of FIG. 6*a* with the rod removed.

As an alternative to a discrete heat pipe or an integral heat pipe using a discrete wick or a roughened integral surface, the wick may be made from sintered or powdered material which is wettable by the coolant. This is accomplished by impregnating the dielectric heat pipe wall material with the powder or sintered material. Referring to FIG. 6*a*, a heat pipe channel 622 in a dielectric body 630 extends to a surface 630*es*. A rod 610 having a diameter smaller than the diameter of the heat pipe channel 622 is inserted into the heat pipe channel, thereby leaving an interstice 620. Powdered or sintered wick material is introduced into the interstice 620, and packed down by mechanical or pneumatic means. FIG. 6*b* illustrates a cross-section of the heat pipe channel 622 with the rod 610 removed after the application of the wick material. The wick material is affixed to the walls of channel 622 to define a wick 652.

Figure 7A:
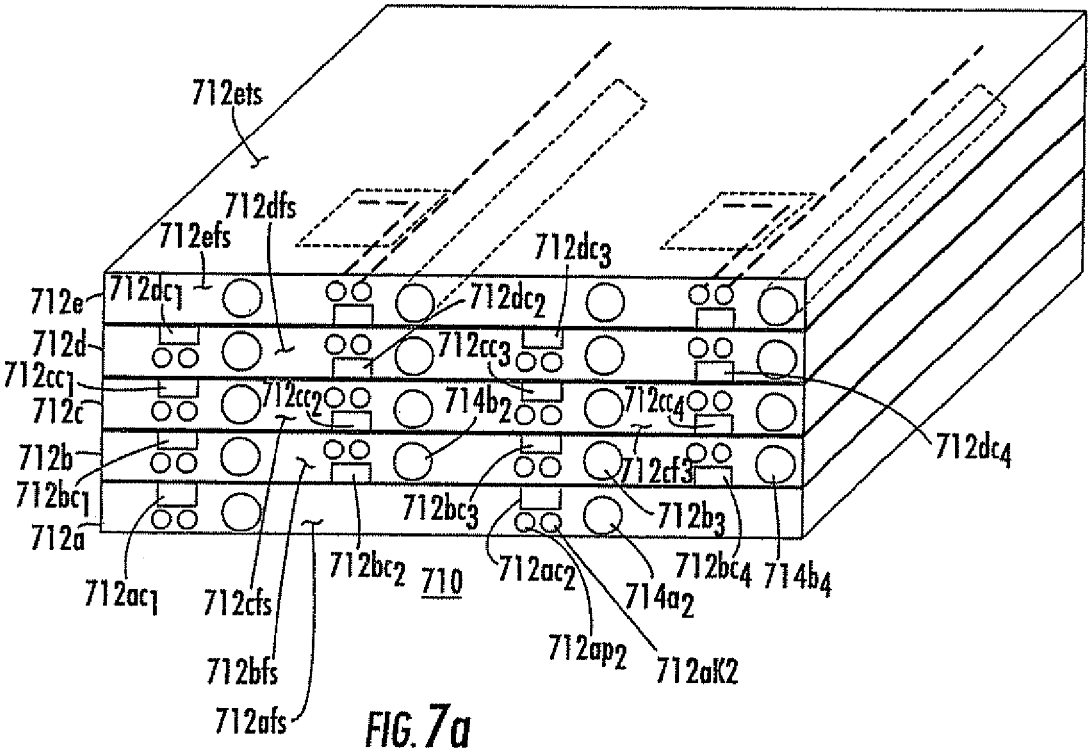
FIG. 7*a* is a perspective or isometric view of a stack of plates according to an aspect of the invention.

FIG. 7*a* is a simplified cross-sectional illustration of a stack 710 of generally planar dielectric elements which together define a plurality of layers of waveguides and locations for MMICs, in a form which is suitable for high-density applications. Such applications may include transmit-receive modules for closely spaced antenna elements of an array, or for processing associated with a beamformer. In FIG. 7*a*, a stack of dielectric slabs or planar structures 712*a*, 712*b*, 712*c*, 712*d*, and 712*e* defines an upper surface 712*ets* and a front surface made up of the juxtaposed front surfaces 712*afs*, 712*bfs*, 712*cfs*, 712*dfs*, and 712*efs*. The upper and lower plane surfaces of stack layers or slabs 712*a*, 712*b*, 712*c*, 712*d*, and 712*e* are metallized or otherwise processed to form an electrically conductive surface. The front surface reveals some interior details of the stack 710. More particularly, layer or slab 710*a* shows first and second grooves or channels 712*ac*1 and 712*ac*2, the interiors of which are metallized as described in conjunction with the channels of FIG. 1*a*, so as to define, together with the electrically conductive plane surfaces of the next adjacent slab, an electromagnetic waveguide, much as described in conjunction with the other embodiments. Interiorly located slabs, such as slab 712*d* of FIG. 7*a*, exhibit channels on both their upper and lower surfaces; channels 712*dc*1 and 712*dc*3 are upward-facing, adjacent to next higher slab 712*e*, while channels 712*dc*2 and 712*dc*4 face downward toward next lower slab 712*c*. Each of channels 712*dc*1, 712*dc*2, 712*dc*3, and 712*dc*4 forms a waveguide with the associated electrically conductive planar surface of the adjacent slab.

Also visible at the front surface of each of the slabs of FIG. 7*a* is an opening, illustrated as being circular, which represents a cross-section of a heat pipe extending through at least a portion of the slab. In FIG. 7*a*, the right-most such opening of slab 712*a* is designated 714*a*2, and the three right-most openings of slab 712*b* are designated 712*b*2, 712*b*3, and 712*b*4. Other openings, not separately designated, also represent the cross-sections of heat pipes.

Each channel of each slab of FIG. 7*a* is associated with two bundles of electrical conductors, one for power and one for control of an associated MMIC or digital microchip. In FIG. 7*a*, the electrical power conductor bundle associated with channel 712*ac*2 is designated 712*ap*2, and the control conductor bundle is designated 712*ak*2. Other such bundles of conductors serve the same purpose, but are not separately designated. Of course, those skilled in the art will understand that under some circumstances bundles of conductors may be added or deleted.

Figure 7B:
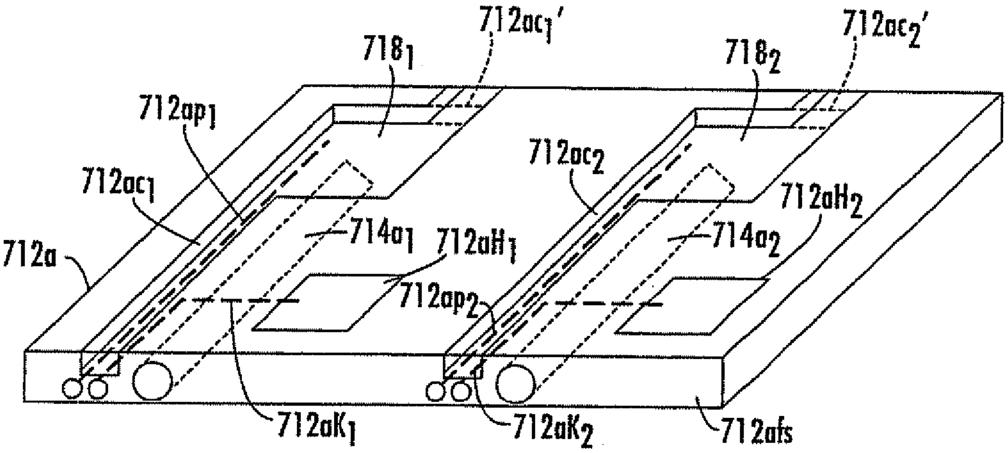
FIG. 7*b* is a simplified perspective or isometric view of a plate of the stack of FIG. 1*a*.

FIG. 7*b* illustrates in perspective or isometric view one simplified top or bottom slab of the stack of FIG. 7*a*, which is identified as slab 712*a* for definiteness. As illustrated in FIG. 7*b*, the channel 712*ac*1 of slab 712*a* extends from front surface 712*afs* to a chamber or depression $\mathbf{718}_1$, dimensioned to accommodate a suitable MMIC (not illustrated). A further channel, designated 712*ac*1', extends from a remote surface of the slab 712*a* to the depression $\mathbf{718}_1$, to carry signal to another device, or to act as an antenna as described above. Note that one end of heat pipe aperture 714*a*1 extends to the region below depression $\mathbf{718}_1$, to help in carrying away the heat of a MMIC placed in depression $\mathbf{718}_1$.

Also illustrated in FIG. 7*b* is a hatched location 712*a*H1, which represents another depression adapted for accommodating a control microchip. Control conductor bundle 712*a*K1 extends from front surface 712*afs* to the region of depression 712*a*H1. FIG. 7*b* also illustrates another depression 7182, output channel 712*ac*2', heat pipe 714*a*2, control module depression 712*a*H2, and control conductor bundle 712*ak*2, all in self-evident relation to the other elements of slab 712*a*.

Figure 7C:
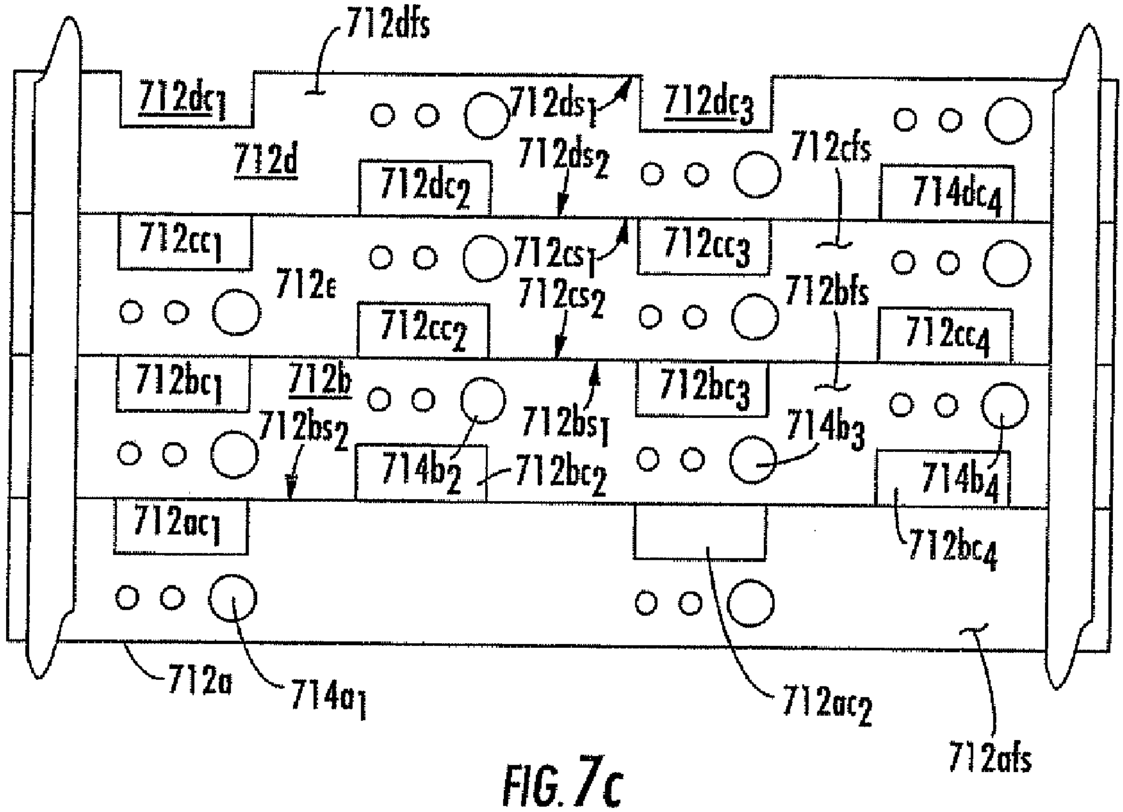
FIG. 7*c* is an elevation view of an arrangement similar to that of FIG. 1*a*.
Figure 7D:
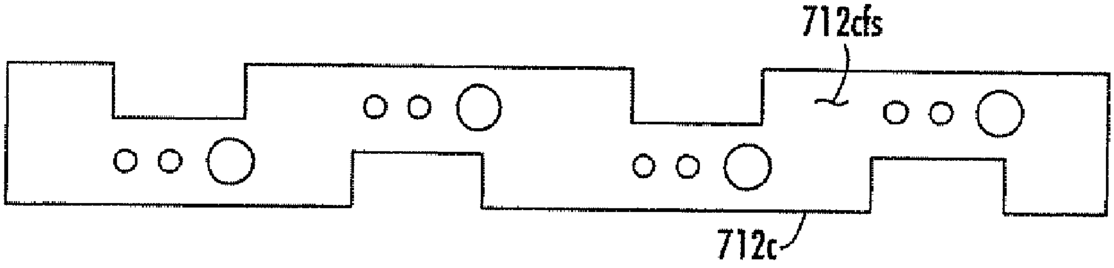
FIG. 7*d* is an elevation view of a single plate of the arrangement of FIG. 7*c*.

FIG. 7*c* is a simplified end view of a portion of the structure 710 of FIG. 7, showing fasteners 720*a* and 720*b* which can be applied across the set of stacked slabs 712*a*, 712*b*, 712*c*, . . . to hold them in juxtaposition and registry, if not otherwise registered. FIG. 7*d* represents an end view of an interior slab of the structure of FIG. 7*a*. This common stacking piece comprises embedded power and control conductors, heat pipes, cavities for RF conduction andor beamforming, and depressions or spaces for MMICs and other chips and components. Among other components which might be considered for use is bypass capacitors on the power conductors, for reducing unwanted coupling between power conductors at RF frequencies.

While the waveguides connecting to the recess(es) have been described as being of the same size, those skilled in the art will understand that they may be of different sizes if frequency translation occurs in the active device occupying the recess, so that the input and output frequencies are different.

A method for making an integrated active antenna array element according to an aspect of the invention includes the steps of placing partially within a first mold (330) at least a first electrical power conductor set (20) extending to a first location adjacent a predetermined location (18) within the mold (330), and placing at least partially within the mold (330) at least one heat pipe (22) extending to a second location which is adjacent the predetermined location (18). The first mold (330) is filled with solid dielectric material in such a manner as to define a first planar surface (12*ps*). A first elongated cavity (16*a*) is defined in the first planar surface (12*ps*). The first elongated cavity (16*a*) extends from an edge (12*es*1) of the solid dielectric material (12) to a third location ($16_1$) within the solid dielectric material adjacent the predetermined location (18), a second elongated cavity (16*b*) extends from a fourth location ($16_2$) within the solid dielectric material (12) to another edge (12*es*2) of the solid dielectric material (12), and the first planar surface also defines at least a first recess (18) adjacent the first, second, third and fourth locations within the solid dielectric material (12). The method includes the step of applying an electrically conductive material (24), such as a metal, to the first planar surface (12*ps*), and to the first (16*a*) and second (16*b*) elongated cavities. The step of applying may include plating or adhesive application, or other techniques such as flashing. A solid-state active device (38) is placed at least partially within the first recess (18). The solid-state active device (38) defines a power terminal (38*p*) adjacent the first location (18), and first (38*i*) and second (380) RF ports adjacent the third ($16_1$) and fourth ($16_2$) locations. The power conductor (20) is connected to a power terminal (38*p*) of the solid-state active device (38), and the first (38*i*) and second (38*o*) RF ports, respectively, are adjacent to the first (16*a*) and second (16*b*) elongated cavities at the third ($16_1$) and fourth ($16_2$) locations, respectively. The second mold (corresponding to 330) is filled with second solid dielectric molding material (14) in such a manner as to define a second planar surface (14*ps*), and a third elongated cavity (16*a*') is defined in the second planar surface (14*ps*). The third elongated cavity (16*a*') extends from an edge (14*es*1) of the second solid dielectric (14) to a fifth location ($16_1$') within the second solid dielectric (14), and a fourth elongated cavity (16*b*') extends from a sixth location ($16_2$') within the second solid dielectric (14) to another edge (14*es*2) of the second solid dielectric (14). The first (12*ps*) and second (14*ps*) planar surfaces are juxtaposed, with the third (16*a*') and fourth (16*b*') elongated cavities registered with the first (16*a*) and second (16*b*) elongated cavities, respectively, to define hollow electromagnetic waveguides extending from the first (12/14*es*1) and second (12/14*es*2) edges to the first (38*i*) and second (380) RF ports of the active device (38), respectively, and coupled thereto. In a particularly advantageous mode of this aspect of the invention, digital control electrical conductors (30) are at least partially inserted into the second mold (corresponding to 330) before filling with dielectric material (14), and a second recess (28) is defined within the solid dielectric material (14) in the second mold (corresponding to 330), the second recess (28) intersecting the digital control electrical conductors (30). A solid-state active digital device (48) defining at least digital ports (48*dp*) is placed at least partially within the second recess (28), with the digital ports (48*dp*) in communication with the digital control electrical conductors (30). The step of filling the first mold (330) with solid dielectric molding material (12) may comprise the step of filling the first mold (330) with liquid molding material, and hardening the liquid molding material to form the solid dielectric material, or it may comprise the steps of filling the first mold (330) with solid material, and milling the first (16*a*) and second (16*b*) cavities and the first recess (18) from the resulting solid material. As an alternative to milling, the step of defining a first elongated cavity (16*a*), a second elongated cavity (16*b*), and at least a first recess (18) in the first planar surface (12*ps*), comprises the steps of defining at least first (316*a*) and second (316*b*) elongated ridges and a first elevated region (310) in a planar surface (330*pb*) of the first mold (330), to thereby define the first (16*a*) and second (16*b*) elongated cavities and the first recess (18) in the planar surface (12*ps*) of the dielectric molding material when the dielectric molding material is removed from the first mold (330).

According to another aspect of the invention, an arrangement comprises a solid dielectric mass (12) enclosing an encapsulated heat-producing active electrical element (38), and also enclosing a heat pipe (22) in thermal communication (490) with the electrical element (38). The heat pipe (22) is defined by an elongated channel (422*a*, 422*b*), the inner surface or wall (422*bis*) of which is a surface of the dielectric molding material. The heat pipe channel (422*a*, 422*b*) extends through the dielectric mass (12) to a location (422*a*, 422*b*) remote from the electrical element (38). The channel (422*a*, 422*b*) defining the heat pipe in this aspect of the invention is defined only by the hollowed-out dielectric molding material, and not by any other material. The heat pipe (22) also includes a wick (452, 516) extending along substantially the entire length of the channel (422*a*, 422*b*) and a vaporizable coolant liquid (452) within the channel. In a particular embodiment (FIG. 6) of this aspect of the invention, the wick (652) comprises powdered material, which may be at least partially metallic. The wick is wetted by the coolant (494). In another embodiment, the wick comprises a roughened surface (516), and the roughened surface (516) may be defined by at least longitudinal grooves in the defining channel.

A method for making an encapsulated heat pipe according to another aspect of the invention comprises the steps of placing a removable elongated solid (material) (512) partially within a mold (510), and filling the mold (510) with solid dielectric material. This may be done by filling the mold (510) with hardenable liquid dielectric molding material. The elongated solid (512) is removed from the dielectric material, to thereby define an elongated cavity (532) extending within the solid dielectric material. Wick material (452, 652) is inserted into the periphery of the elongated cavity (532, 622). Coolant liquid (494) is introduced or injected into the elongated cavity, and the open end of the elongated cavity is closed or sealed. In a particularly advantageous mode of this method, the step of inserting wick (452, 652) material includes the steps of inserting into the elongated cavity (622) a rod (610) having transverse dimensions smaller than those of the cavity (622), and inserting powdered wick material (652) into the interstice (620) between the rod (610) and the elongated cavity (622). In a further advantageous variant of this aspect of the invention, the step of placing a removable elongated solid (512) partially within a mold (330) includes the step of placing partially within the mold (330) a removable elongated solid (512) having an outer surface defining longitudinally disposed lands and grooves (516), which thereby result in corresponding longitudinal grooves and lands, respectively, in the elongated cavity (422).

A method according to an aspect of the invention is for making an integrated active antenna array element (210) with an integral antenna (230). The method comprises the steps of placing partially within a first mold (3) at least a first power electrical conductor set (20) which extends to a first location adjacent a predetermined location (18), and placing at least partially within the mold at least one heat pipe (22) extending to a second location adjacent the predetermined location (18). The first mold (3) is filled with solid dielectric material (12) in such a manner as to define a first planar surface (12*ps*), and to also define in the first planar surface (12*ps*) a first elongated cavity (18*a*) extending from an edge (12*es*1) of the solid dielectric material (12) to a third location ($16_1$) adjacent the predetermined location (18) within the solid dielectric material (12), a second elongated cavity (16*b*) extending from a fourth ($16_2$) location adjacent the predetermined location (18) within the solid dielectric material (12) to another edge (12*es*2) of the solid dielectric material (12), and also defining at least a first recess (18) adjacent the first, second, third ($16_1$) and fourth ($16_2$) locations within the solid dielectric material (12), the first elongated cavity (16*a*) having sides which run parallel with a central axis (8) of the first channel (16*a*) or are mutually parallel, and the second elongated cavity (16*b*) having at least one pair of diverging sides, or at least one side which diverges away from the central axis (8) of the second elongated cavity (16*b*) adjacent the other edge (12*es*2) of the solid dielectric material (12), and optionally having parallel sides or sides extending parallel to the central axis (8) adjacent the fourth location ($16_2$). Electrically conductive material is applied to the first planar surface (12*ps*), and to the first (16*a*) and second (16*b*) elongated cavities. A solid-state active device (38) is placed at least partially within the first recess (18). The solid-state active device (38) defines a power terminal (38*p*) adjacent the first location, and first (38*i*) and second (380) RF ports adjacent the third ($16_1$) and fourth ($16_2$) locations. The power conductor (20) is connected to the power terminal (38*p*) a solid-state active device (38), with the first (38*i*) and second (38*o*) RF ports, respectively, adjacent to the first (16*a*) and second (16*b*) elongated cavities at the third ($16_1$) and fourth ($16_2$) locations, respectively. The second mold (4) is filled with second solid dielectric molding material (14) in such a manner as to define a second planar surface (lops) and a third elongated cavity (16*a*') extending from an edge (14*es*1) of the second solid dielectric (14) to a fifth location ($16_1$') within the second solid dielectric (14), and a fourth (16*b*') elongated cavity extending from a sixth ($16_2$') location within the second solid dielectric (14) to another edge (14*es*2) of the second solid dielectric (14). The first and second planar surfaces are juxtaposed, with the third (16*a*') and fourth (16*b*') elongated cavities similarly dimensioned to the first (16*a*) and second (16*b*) elongated cavities, respectively, and registered with the first (16*a*) and second (16*b*) elongated cavities, respectively, to define electromagnetic waveguides extending from the first (12*es*1, 14*es*1) and second (12*es*2, 14*es*2) edges to the first (38*i*) and second (380) RF ports of the active device (38), respectively, and coupled thereto.

A method for making at least one, or in some modes of the method, a plurality of electrically conductive hollow waveguides for carrying electromagnetic signal. The method comprises the step of defining at least an elongated first slot (712*cc*1) extending from an edge (such as 712*cfs*) of a generally planar solid dielectric first slab (712*c*), across at least a portion of a first broad surface (712*cs*1) thereof. The defining step may be accomplished by cutting into the broad surface, or by molding the dielectric with the slot in situ. An elongated second slot (712*cc*2) is defined, extending from an edge of the generally planar solid dielectric first slab (712*c*), across at least a portion of a second broad surface (712*cs*2) thereof. At least one elongated first slot (712*dc*1) is defined, extending from an edge of a generally planar solid dielectric second slab (712*d*), across at least a portion of a first broad surface (712*ds*1) thereof. At least an elongated second slot (712*dc*2) is defined, extending from an edge of the generally planar solid dielectric second slab (712*d*), across at least a portion of a second broad surface (712*ds*2) thereof. At least the surfaces of the first (712*cc*1; 712*dc*1) and second (712*cc*2; 712*dc*2) slots, and at least portions of the first (712*cs*1; 712*ds*1) and second (712*cs*2; 712*ds*1) broad surfaces of the first (712*c*) and second (712*d*) slabs, are rendered conductive. The rendering conductive may be by application of an electrically conductive material, such as a metal, to the dielectric surfaces. The first broad surface (712*cs*1) of the first slab (712*c*) is juxtaposed with the second broad surface (712*ds*2) of the second slab (712*d*), with the first slot (712*cc*1) of the first slab (712*c*) registered with electrically conductive portions of the second broad surface (712*ds*2) of the second slab (712*d*), which results in defining a circumferentially-closed, electrically conductive tube or channel (712*cc*1), suitable for carrying electromagnetic signal.

In a particularly advantageous mode of this aspect of the invention, further steps are added. The further steps include the steps of defining at least an elongated first slot (712*bc*1) extending from an edge (712*bfs*) of a generally planar solid dielectric third slab (712*b*), across at least a portion of a first broad surface (712*bs*1) thereof, and defining at least an elongated second slot (712*bc*2) extending from an edge of the generally planar solid dielectric third slab (712*b*), across at least a portion of a second broad surface (712*bs*2) thereof. At least the surfaces of the first (712*bc*1) and second (712*bc*2) slots, and at least portions of the first (712*bs*1) and second (712*bs*2) broad surfaces, of the third slab (712*b*) are rendered conductive. The first broad surface (712*bs*1) of the third slab (712*b*) is juxtaposed with the second broad surface (712*cs*2) of the first slab (712*c*), with the first slot (712*bc*1) of the third slab (712*b*) registered with the electrically conductive portions of the second broad surface (712*cs*2) of the first slab (712*c*). This has the result of producing electrically conductive tubes on both sides of the first slab (712*c*).

What is claimed is:

1. An arrangement comprising a solid dielectric mass enclosing a heat-producing active electrical element, the solid dielectric mass defining a heat pipe in thermal communication with said heat-producing active electrical element, wherein said heat pipe consists of an elongated channel in said solid dielectric mass, the inner surface of which elongated channel is said solid dielectric mass, the heat pipe extending through said solid dielectric mass to a location remote from said electrical element, wherein said heat pipe also includes a wick extending along substantially the entire length of said channel and a vaporizable coolant liquid within said channel; and wherein the solid dielectric mass comprises first and second opposing slabs of dielectric material, opposing planar surfaces of said first and second opposing slabs comprising electrically conductive surfaces in contact with each other.

2. An arrangement according to claim 1, wherein said wick comprises powdered material.

3. An arrangement according to claim 2, wherein said powder comprises metallic material.

4. An arrangement according to claim 1, wherein said wick is wetted by said coolant.

5. An arrangement according to claim 1, wherein said wick comprises a roughened surface.

6. An arrangement according to claim 5, wherein said roughened surface defines at least longitudinal grooves.

7. The arrangement according to claim 1, wherein the first and second opposing slabs of dielectric material each comprises one half of the heat pipe.

8. An arrangement according to claim 7, wherein a first portion of the heat pipe is defined in the first opposing slab and the second portion of the heat pipe is defined in the second opposing slab, and wherein the first and second portions are registered when the first and second opposing slabs are juxtaposed to form the elongated channel.

9. An arrangement according to claim 1, wherein the heat pipe walls consist of the hollowed-out dielectric material, and not any other material.

10. An arrangement comprising:

a solid dielectric mass enclosing a heat-producing electrical element, the solid dielectric mass defining an elongated channel, a heat pipe consisting of said elongated channel, the heat pipe further being in thermal communication with the electrical element, wherein the inner surface of the heat pipe is said solid dielectric mass, wherein said heat pipe further comprises a wick extending along substantially the entire length of said channel, and a vaporizable coolant liquid disposed within said channel; and wherein the solid dielectric mass comprises first and second opposing slabs of dielectric material, opposing planar surfaces of said first and second opposing slabs comprising electrically conductive surfaces in contact with each other.

11. An arrangement according to claim 10, wherein the first and second opposing slabs of dielectric material are provided with registration pins and corresponding registration holes for aligning the slabs with each other.

12. An arrangement according to claim 11, wherein a first portion of the heat pipe is defined in the first opposing slab and the second portion of the elongated channel is defined in the second opposing slab, and wherein the first and second portions are registered when the first and second opposing slabs are juxtaposed to form the heat pipe.

13. An arrangement according to claim 10, wherein the heat pipe walls consist of the hollowed-out dielectric material, and not any other material.

14. An arrangement according to claim 10, wherein the heat pipe defined by the elongated channel has a center region and first and second ends, the center region being at a location near the heat-producing electrical element, the first and second ends being at a location remote from the heat-producing electrical element.

15. An arrangement comprising:

a solid dielectric mass enclosing a heat-producing electrical element, the solid dielectric mass defining an elongated channel, a heat pipe consisting of said elongated channel, the heat pipe further being in thermal communication with the electrical element, wherein the solid dielectric mass is comprised of first and second opposing slabs of dielectric material, opposing planar surfaces of said first and second opposing slabs comprising electrically conductive surfaces in contact with each other;

wherein a first portion of the elongated channel is formed in the first opposing slab and a second portion of the elongated channel is formed in the second opposing slab, and wherein the first and second portions are registered when the first and second opposing slabs are juxtaposed to form the elongated channel;

wherein the inner surface of the elongated channel is said solid dielectric mass, and wherein said heat pipe further comprises a wick extending along substantially the entire length of said channel, and a vaporizable coolant liquid disposed within said channel.

16. An arrangement according to claim 15, wherein the wick comprises a roughened surface.

17. An arrangement according to claim 15, wherein the first and second opposing slabs of dielectric material each comprises one half of the heat pipe.

18. An arrangement according to claim 1, further comprising a first recess formed in the planar surface of the first opposing slab and a second recess formed in the planar surface of the second opposing slab, wherein surfaces of said first and second recesses are electrically conductive; and wherein the first and second recesses cooperate to form an electrically conductive channel when the first and second opposing slabs are connected.

19. An arrangement according to claim 18, wherein the electrically conductive channel is a rectangular waveguide.

20. An arrangement according to claim 10, further comprising a first recess formed in the planar surface of the first opposing slab and a second recess formed in the planar surface of the second opposing slab, wherein surfaces of said first and second recesses are electrically conductive; and wherein the first and second recesses cooperate to form an electrically conductive channel when the first and second opposing slabs are connected.

21. An arrangement according to claim 20, wherein the electrically conductive channel is a rectangular waveguide.

22. An arrangement according to claim 15, further comprising a first recess formed in the planar surface of the first opposing slab and a second recess formed in the planar surface of the second opposing slab, wherein surfaces of said first and second recesses are electrically conductive; and wherein the first and second recesses cooperate to form an electrically conductive channel when the first and second opposing slabs are connected.

23. An arrangement according to claim 22, wherein the electrically conductive channel is a rectangular waveguide.

* * * * *